(12) United States Patent
Saugier

(10) Patent No.: US 7,393,215 B2
(45) Date of Patent: Jul. 1, 2008

(54) ASSEMBLY OF A MOBILE OBJECTIVE ABOVE AN OPTICAL SENSOR

(75) Inventor: Eric Saugier, Villard Bonnot (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 11/533,316

(22) Filed: Sep. 19, 2006

(65) Prior Publication Data

US 2007/0066093 A1    Mar. 22, 2007

(30) Foreign Application Priority Data

Sep. 20, 2005    (FR) .................................. 05 52825

(51) Int. Cl.
*H01R 12/00*    (2006.01)

(52) U.S. Cl. .......................................... 439/71

(58) Field of Classification Search .................. 439/70, 439/71, 67, 66; 359/696, 126, 824, 811, 359/817; 348/335, 374; 257/434, 294, 680

See application file for complete search history.

(56) References Cited

U.S. PATENT DOCUMENTS

| | | | |
|---|---|---|---|
| 6,392,827 B1 * | 5/2002 | Ueyama et al. | 359/824 |
| 6,483,101 B1 * | 11/2002 | Webster | 250/216 |
| 7,046,296 B2 * | 5/2006 | Shinomiya | 348/374 |
| 7,088,397 B1 * | 8/2006 | Hunter et al. | 348/374 |
| 7,190,404 B2 * | 3/2007 | Shinomiya | 348/374 |
| 2002/0002012 A1 * | 1/2002 | Torii | 439/625 |

\* cited by examiner

*Primary Examiner*—Alexander Gilman
(74) *Attorney, Agent, or Firm*—Lisa K. Jorgenson; Harold H. Bennett, II; Seed IP Law Group PLLC

(57) ABSTRACT

An assembly structure of a mobile objective above an optical sensor assembled on a support board includes a cover assembled on the support board with an opening facing the sensor, this cover having a conical external surface with an axis orthogonal to the support board. The structure also includes a frame having first and second elements, shiftable with respect to each other under the action of an electric motor. The first frame element has a conical internal surface capable of mating with the conical external surface of the cover to ensure its positioning and to put resilient connection blades of a fixed portion of the motor in contact with pads formed on the support board, and the second frame element supports the objective and a shiftable portion of the motor.

24 Claims, 2 Drawing Sheets

ASSEMBLY OF A MOBILE OBJECTIVE ABOVE AN OPTICAL SENSOR

BACKGROUND OF THE INVENTION

1. Field of the Invention

The present invention generally relates to the forming of an electronic shooting system—photographic camera or video camera—with a variable focal length to obtain a focusing or a zoom effect.

2. Description of the Related Art

Generally, an electronic photographic or video camera comprises a semiconductor chip on which are formed a network of optical sensors and, possibly, associated processing circuits. A lens or, more generally, an optical objective having its axis corresponding to an axis orthogonal to the center of the optical sensor network is arranged in front of the chip.

The present invention more specifically relates to a variable-focal-length optical system, that is, a system in which the plane of the objective may be displaced in the direction of the optical axis, parallel to the sensor plane. For this purpose, the objective assembly comprises a motor for shifting the objective along the optical axis. This motor is an electric motor which is controlled by circuits which are associated with the sensor chip or which are arranged on another chip assembled on the same support as the sensor chip. This support generally is a plate of printed circuit board type. An electric connection between pads on this printed circuit board and connection terminals of the motor must then be provided.

The various known solutions to assemble a variable-focus shooting system are relatively heavy-duty and all exhibit various disadvantages.

In certain conventional solutions, the motor connectors are connected to the pads on the optical card by a flexible connection, which implies relatively high costs due to its requiring weldings. Further, such weldings generally are a source of weakness of the electric system.

In certain conventional solutions, the lens mount is glued on the support (the printed circuit board) of the sensor. However, since this gluing must be performed so that the optical axis of the objective and the axis perpendicular to the center of the sensor chip are confounded, complex means, expensive and long to use, of relative XY positioning of the sensor chip and of the objective mount must be provided.

BRIEF SUMMARY OF THE INVENTION

An embodiment of the present invention provides a simple and inexpensive system of assembly and connection of a mobile objective on an optical sensor chip support board.

An embodiment of the present invention provides a structure of assembly of a mobile objective above an optical sensor assembled on a support board, comprising a cover assembled on the support board and including an opening facing the sensor, this cover having a conical external surface with an axis orthogonal to the support board; and a frame comprising first and second elements, shiftable with respect to each other under the action of an electric motor, the first frame element having a conical internal surface capable of coupling with the conical external surface of the cover to ensure its positioning and to put resilient connection blades of a fixed portion of the motor in contact with pads formed on the support board, and the second frame element supporting the objective and a shiftable portion of the motor.

According to an embodiment of the present invention, the external and internal conical surfaces comprise complementary clipping means.

According to an embodiment of the present invention, the first and second frame elements are linked to each other by complementary means of shifting along the axis direction.

According to an embodiment of the present invention, the shifting means comprise rods coupled to the first frame element and openings formed in the second frame element.

According to an embodiment of the present invention, the first frame element has the general shape of a ring.

According to an embodiment of the present invention, the second frame element is formed of an external ring supporting the mobile portion of the motor and comprising the shifting means and an internal ring which screws inside of the first ring.

According to an embodiment of the present invention, a filter plate is assembled at the cover opening level.

One embodiment of the present invention also provides a variable-focus shooting system comprising a structure of assembly of a mobile objective above an optical sensor of the above type.

The foregoing and other features and advantages of the present invention will be discussed in detail in the following non-limiting description of specific embodiments in connection with the accompanying drawings.

DETAILED DESCRIPTION OF THE INVENTION

Figure 1:
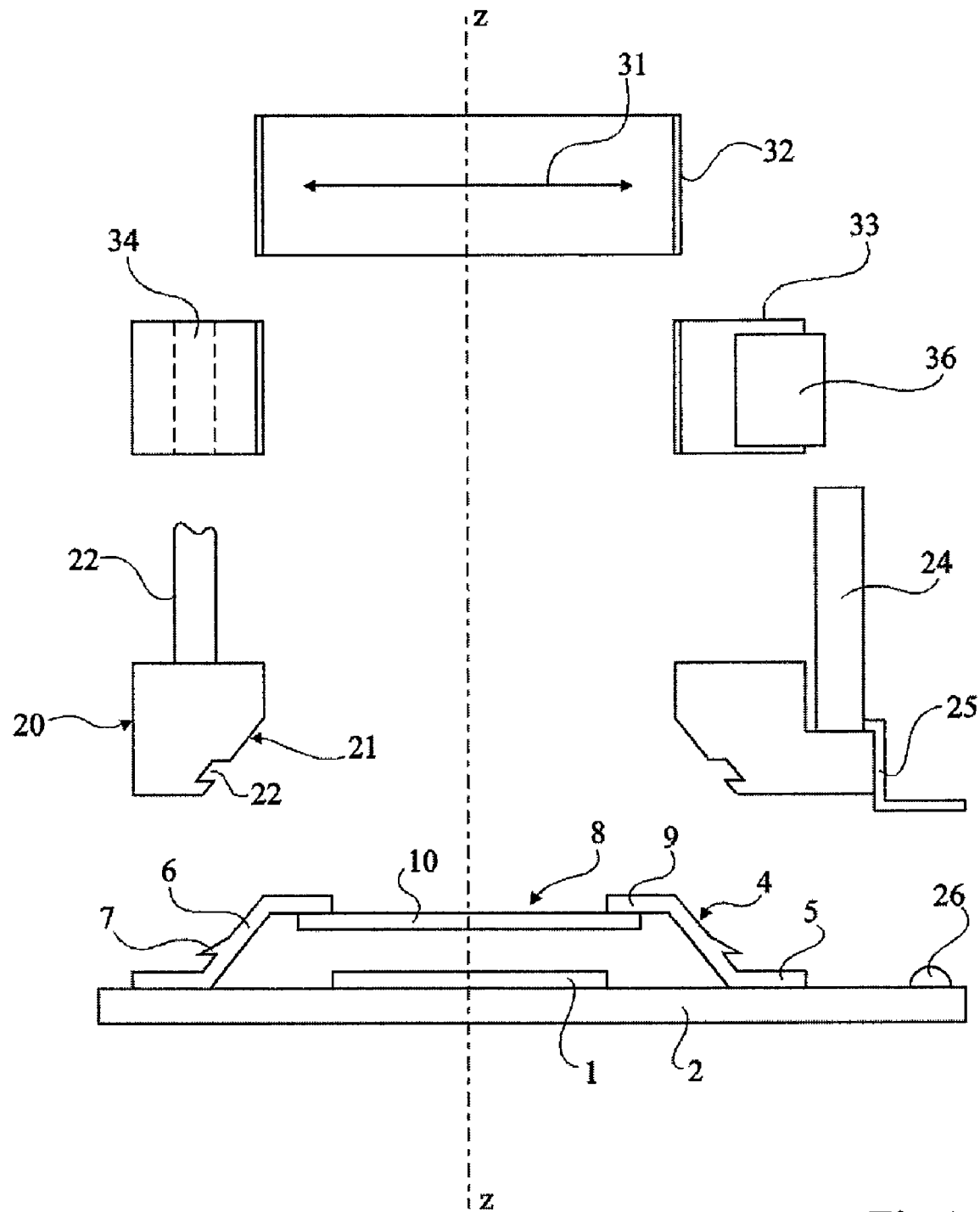
FIG. 1 is a simplified exploded view of the assembly of a chip containing a network of optical sensors and of a variable-focus objective according to the present invention.

For clarity, the same elements have been designated with the same reference numerals in the different drawings and, further, the figures are not necessarily drawn to scale.

FIG. 1 shows an embodiment according to the present invention of a mobile objective structure associated with an optical sensor. The optical sensor is formed of an integrated circuit chip 1 assembled on a support board 2, for example, a printed circuit board which may support other electronic components, and which is provided with means of connection between these components and possibly with means for plugging into a connector.

An embodiment of the present invention provides associating a cover 4 with support board 2. This cover comprises portions 5 for bearing against support board 2 and a cone-shaped portion 6, the cone having its summit opposite to the printed circuit board and having its axis aligned with the line ZZ normal to the center of optical sensor 1. The cone edges comprise clipping means 7. The cone may have a circular cross-section or a square cross-section, or have any other selected cross-section shape, the term "conical" being understood as comprising the term "pyramidal." An upper portion of cover 4 comprises an opening 8 arranged opposite to sensor 1. Opening 8 is for example defined in upper horizontal portions 9 of the cover, to which is preferably attached a plate 10 of a material that filters infrared radiations, if an optical device only sensitive to visible light is desired to be obtained. Any appropriate filtering means, such as a glass plate possibly coated with an appropriate filter, may be used.

The cover 4 may be attached to the support board 2 by any of a number of coupling methods, including, for example, applying adhesive between the portions 5 and the surface of the support board, soldering the portions 5 to metallic pads provided for this purpose on the support board, and engaging apertures formed in the support board with corresponding features of the cover 4.

The objective is assembled in a frame formed of two elements mobile with respect to each other. First frame element 20 has the general shape of a ring comprising on its lower surface side a conical surface 21 complementary to conical surface 6 of cover 4. This conical surface also comprises a clipping element 22 complementary to clip 7 formed on conical surface 6, which allows the first frame element to snap onto the cover 4. Clip 7 has here been shown as a raised element and complementary clip 22 has been shown as a recessed element. Any other shape of coupling structures enabling interconnection may be used by those skilled in the art.

Thus, when ring 20 is positioned on cover 4, it is perfectly adjusted with respect to this cover in plane XY, that is, the plane of printed circuit board 2, due to the conical fit assembly, and it is maintained fixed by the clip system. There may exist an inaccuracy in the vertical direction but, given that this embodiment of the present invention provides an objective shiftable in the vertical axis direction, this play may be compensated for. Instead of clips, a gluing may be provided, which suppresses the vertical play.

To first frame element 20 are rigidly associated, on the one hand, guiding elements 22, such as, for example, vertical rods intended to slidably receive the second frame element, and on the other hand, a first element or fixed element 24 of an electric motor. According to an aspect of the present invention, connection blades 25 ensure the connection between terminals of motor 24 and pads 26 arranged on the support board. Connection blades 25 are flexible blades which, when ring 20 is snapped onto cover 4, come in resilient pressure contact with pads 26. Of course, although a very simple contact blade 25 has been shown, various shapes may be selected by those skilled in the art. It may also be provided for contact blades 25 to be folded under ring 20. The pads may be simple metallizations of the support board. As a variation, rigid blades may bear against resilient pads.

In an embodiment of the present invention, the objective symbolically designated with reference numeral 31 is arranged in a ring 32 screwing in a ring 33 forming a second frame element. Of course, the assembly of rings 32 and 33 may be one and the same ring. Ring 33 comprises guiding means formed, for example, of through openings 34 slidably slipping on rods 22 formed integrally with, or otherwise coupled to ring 20 to enable shifting of ring 33 along axis Z. Other shift guiding means may be selected by those skilled in the art. Further, ring 33 comprises a second portion, or mobile portion, of a motor 36 cooperating with fixed portion 24, and that may vertically move under the action of the motor. The first and second frame elements have been shown in the form of three exploded parts. In fact, the three parts may be previously assembled before mounting the frame assembly on cover 4.

In the frame-cover assembly operation, due to the conical assembly of the frame and of the cover, a very accurate positioning is obtained in plane XY. Only along axis Z can a slight inaccuracy occur. This inaccuracy may be compensated for by a greater or lighter screwing of ring 32 in ring 33, or by an action of motor 24-36 to have objective 31 move up or down. It should be noted that, in the frame-cover assembly operation, the contact between contact blades 25 and contact pads 26 is established. Thus, an electric and mechanical assembly, according to the present invention, may be formed quickly and simply, requiring no welding operation nor specific XY-positioning precision tools.

Of course, the present invention is likely to have various alterations, modifications, and improvements which will readily occur to those skilled in the art, especially as concerns the shapes of the various parts that may be selected for functional, ergonomic, and/or esthetic reasons. Those skilled in the art may divide some of the described parts into several elementary parts. Further, the electric objective displacement motor has not bee described, since those skilled in the art may select various types of motors according to the aimed application and to various practical requirements.

The present invention is well adapted to the forming of miniature photographic devices such as those used in cellular phones. The applicant has formed a device according to the present invention in which the dimensions in the horizontal plane (dimensions of board 2) were 12×12 mm$^2$, the height being on the order of 7.5 mm.

Figure 2:
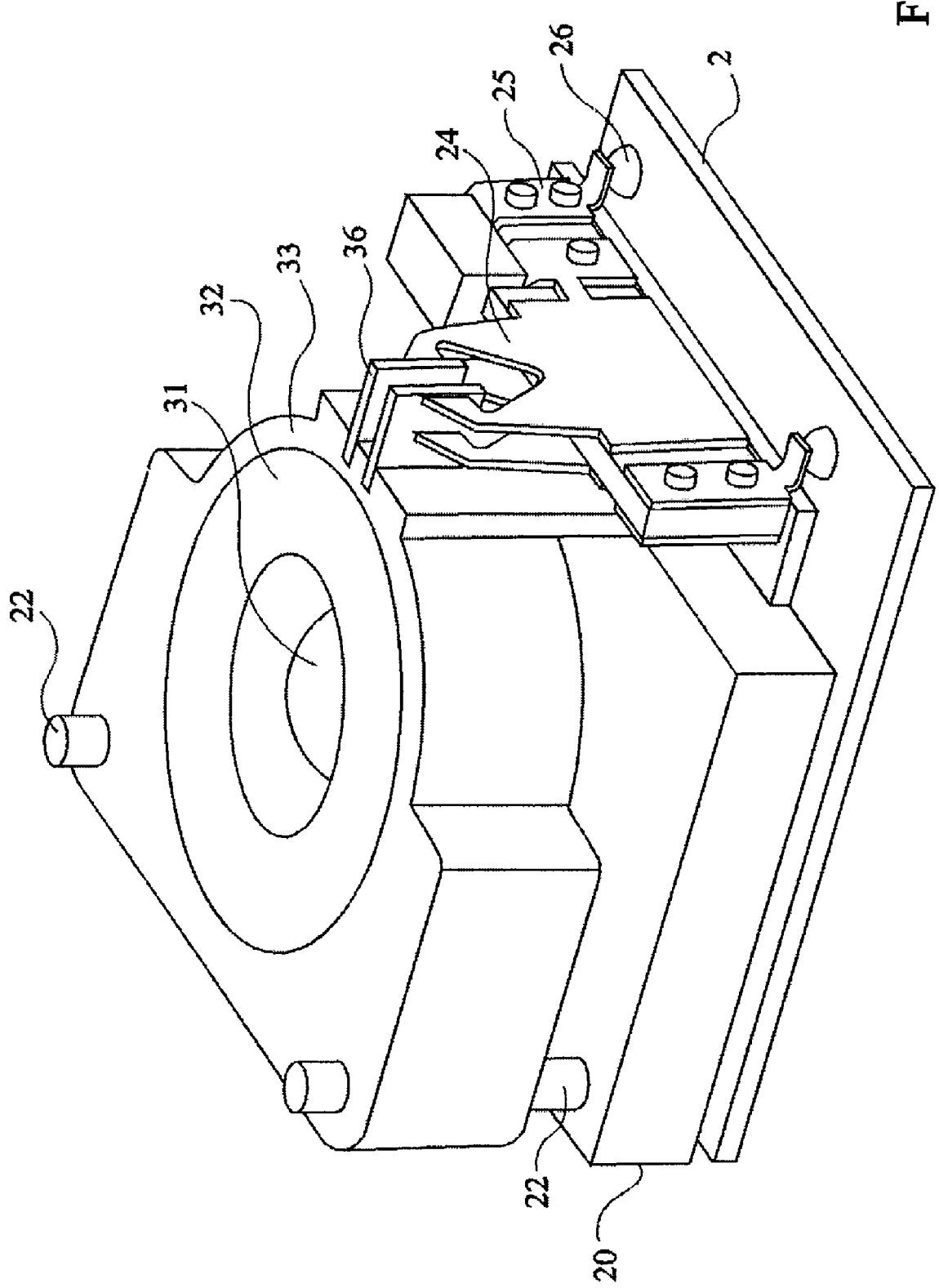
FIG. 2 is a perspective view of a detailed example of one embodiment of the present invention.

A detailed example of an embodiment of a structure according to the present invention is illustrated in the perspective view of FIG. 2 in which same elements as in FIG. 1 are designated with same reference numerals.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A structure of assembly of a mobile objective above an optical sensor assembled on a support board, comprising:
    a cover assembled on the support board and comprising an opening facing the sensor, this cover having a conical external surface with an axis orthogonal to the support board; and
    a frame comprising first and second elements, slidable with respect to each other under the action of an electric motor,
        the first element having a conical internal surface capable of mating with the conical external surface of the cover to ensure the positioning of the first element and to put connection blades of a fixed portion of the motor in resilient contact with pads on the support board, and
        the second element supporting the objective and a shiftable portion of the motor.

2. The structure of claim 1 wherein the external and internal conical surfaces comprise complementary clipping means for clipping the first element to the cover.

3. The structure of claim 1 wherein the first and second frame elements are linked to each other by complementary guiding means for guiding the second frame element along the axis direction, relative to the first frame element.

4. The structure of claim 3, wherein the complimentary guiding means comprise rods coupled to the first frame element and openings formed in the second frame element.

5. The structure of claim 1 wherein the first frame element has the general shape of a ring.

6. The structure of claim 1 wherein the second frame element is in the form of an external ring supporting the mobile portion of the motor and comprises a portion of the complimentary guiding means, and an internal ring which screws inside of the first ring.

7. The structure of claim 1 wherein a filter plate is assembled at the cover opening.

8. A variable-focus shooting system comprising:
    a support board;
    an optical sensor assembled on the support board; and a structure of assembly including:
a cover assembled on the support board having an opening facing the sensor and a conical external surface with an axis orthogonal to the support board;
an optical objective; and
a frame comprising first and second elements, slidable with respect to each other, the first element having a conical internal surface capable of mating with the conical external surface of the cover, the second element supporting the objective over the optical sensor.

9. The system of claim 8, comprising:
electrical pads located on the support board; and
connection blades coupled to the first element and configured to contact the electrical pads while the conical internal surface of the first element is mated with the conical external surface of the cover.

10. The system of claim 8, comprising a motor including a fixed portion coupled to one of the first and second elements, and a shiftable portion coupled to the other of the first and second elements, the motor configured to shift the first and second elements along the axis with respect to each other.

11. The system of claim 8, comprising a guiding structure configured to guide the shifting of the first and second elements along the axis with respect to each other.

12. The system of claim 8, comprising a coupling structure including interconnectable portions of the cover and the first element.

13. A device, comprising:
a cover having a portion configured to be attached to a support board, and a first conical surface;
a frame having first and second elements, the first element having a second conical surface configured to mate with the first conical surface so as to align the cover and the frame along first and second transverse axes, the frame element configured to receive an optical objective having an optical axis corresponding to a third axis transverse to the first and second axes; and
a motor adapted to slide the second frame element relative to the first frame element.

14. The device of claim 13, comprising interconnecting clipping elements coupled to the cover and the frame such that the frame can be snapped onto the cover.

15. The device of claim 13, comprising an optical filter positioned over an opening of the cover.

16. The device of claim 13 wherein the first element includes a first portion of a guiding structure, the second frame element having a second portion of the guiding structure, the first and second portions of the guiding structure being complimentary such that the second frame element is shiftable, relative to the first frame element, along the third axis, the second frame element configured to receive the optical objective.

17. The device of claim 16 wherein the motor includes a fixed portion coupled to the first frame element and a shiftable portion coupled to the second frame element.

18. The device of claim 16, comprising connection elements of the motor coupled to the first frame element and in electrical contact with respective terminals of the motor, and configured to make resilient contact with a surface of the support board when the second conical surface is mated with the first conical surface.

19. The device of claim 16, comprising a guiding structure configured to guide the shifting of the second frame element along the third axis with respect to the first frame element.

20. The device of claim 16 wherein the guiding structure comprises a rod coupled to one of the first and second frame elements and an opening formed in the other of the first and second frame elements and configured to receive the rod therein.

21. A method, comprising:
mounting a cover to a support board above an optical sensor positioned on the support board;
coupling a first frame element to the cover such that a conical surface of the cover engages a conical surface of the first frame element, thereby aligning the first frame element with the cover in first and second orthogonal axes; and
coupling a second frame element to the first frame element such that the second frame element is slidable, relative to the first frame element, along a third axis, orthogonal to the support board.

22. The method of claim 21 wherein the step of coupling the first frame element to the cover comprises snapping the first frame element onto the cover.

23. The method of claim 21 wherein the step of coupling the first frame element to the cover comprises making resilient contact between contact pads of the support board and connection elements of a motor structured to shift the second frame element along the third axis.

24. The method of claim 21 wherein the step of coupling the second frame element to the first frame element comprises engaging a first portion of a guiding structure, part of the first frame element, to a second portion of the guiding structure, part of the second frame element.

* * * * *

UNITED STATES PATENT AND TRADEMARK OFFICE
CERTIFICATE OF CORRECTION

PATENT NO. : 7,393,215 B2 Page 1 of 1
APPLICATION NO. : 11/533316
DATED : July 1, 2008
INVENTOR(S) : Eric Saugier It is certified that error appears in the above-identified patent and that said Letters Patent is hereby corrected as shown below:

Title Page
In Section (56)…References Cited, under U.S. Patent Documents, an omitted reference should be incorporated to reads as -- 2004/0262705…A1…12/2004…Izumi et al.… 257/432 --

In Section (56)…References Cited, an omitted reference should be incorporated to read as -- Foreign Patent Documents…EP…1475960…Maeda Hiroshi et al.…11/2004 --

Column 5
Line 23, "configured to guide the shifting of the first and second elements" should read as -- configured to guide the sliding of the first and second elements --

Signed and Sealed this

Eleventh Day of November, 2008

JON W. DUDAS
*Director of the United States Patent and Trademark Office*